(12) United States Patent
Bultitude

(10) Patent No.: US 8,028,397 B2
(45) Date of Patent: Oct. 4, 2011

(54) METHOD OF MAKING A FRAME PACKAGE ARRAY DEVICE

(75) Inventor: John Bultitude, Monroe, CT (US)

(73) Assignee: Vishay Sprague, Inc., Malvern, PA (US)

( * ) Notice: Subject to any disclaimer, the term of this patent is extended or adjusted under 35 U.S.C. 154(b) by 595 days.

(21) Appl. No.: 12/107,349

(22) Filed: Apr. 22, 2008

(65) Prior Publication Data

US 2008/0189931 A1 Aug. 14, 2008

Related U.S. Application Data

(62) Division of application No. 11/296,141, filed on Dec. 7, 2005, now abandoned.

(60) Provisional application No. 60/733,275, filed on Nov. 3, 2005.

(51) Int. Cl.
*G01R 31/28* (2006.01)

(52) U.S. Cl. .............. 29/593; 29/827; 29/830; 29/831; 29/832; 29/852

(58) Field of Classification Search ............ 29/593, 29/827, 830, 831, 832, 852; 361/301.3, 301.4, 361/541, 801, 328, 398; 156/300, 303; 257/787, 257/724, 534, 105, 109, 150, 151
See application file for complete search history.

(56) References Cited

U.S. PATENT DOCUMENTS

| | | | |
|---|---|---|---|
| 4,966,282 A | 10/1990 | Kawanishi et al. | |
| 5,089,314 A | 2/1992 | Masujima et al. | |
| 5,203,143 A | 4/1993 | Gutentag | |
| 5,493,259 A * | 2/1996 | Blalock et al. | 333/182 |
| 5,655,290 A | 8/1997 | Moresco | |
| 5,765,692 A | 6/1998 | Schenz | |
| 5,846,621 A | 12/1998 | Nagamatsu | |
| 5,990,509 A | 11/1999 | Burns, Jr. et al. | |
| 6,058,004 A * | 5/2000 | Duva et al. | 361/301.4 |
| 6,412,641 B1 | 7/2002 | Anderson | |
| 6,541,874 B2 | 4/2003 | Nguyen et al. | |
| 6,822,850 B2 * | 11/2004 | Pfeifer et al. | 361/611 |
| 2002/0118517 A1 | 8/2002 | Giles et al. | |
| 2003/0231477 A1 * | 12/2003 | Vierow et al. | 361/801 |

FOREIGN PATENT DOCUMENTS

DE 22 23 345 A1 11/1973

* cited by examiner

*Primary Examiner* — Derris H Banks
*Assistant Examiner* — Tai Nguyen
(74) *Attorney, Agent, or Firm* — Volpe and Koenig, P.C.

(57) ABSTRACT

The present invention uses a frame with one or more axial ribs extending from a spine onto which two or more discrete two-terminal electronic components, such as capacitors, resistors, or inductors, can be attached. The function of the frame is to align and space the electronic components in a single device or array that allows the two-terminals of each component to be separately contacted or soldered to a PC board during final assembly into a circuit. The frame may use friction or a bonding agent to hold the components to the frame. Additionally, the base of the frame forms a single surface for the pick and place equipment used in circuit board assembly. The frame and any bonding agent must be capable of sustaining high temperature soldering operations to form electrical contacts in the circuit assembly operation.

Figure 1:
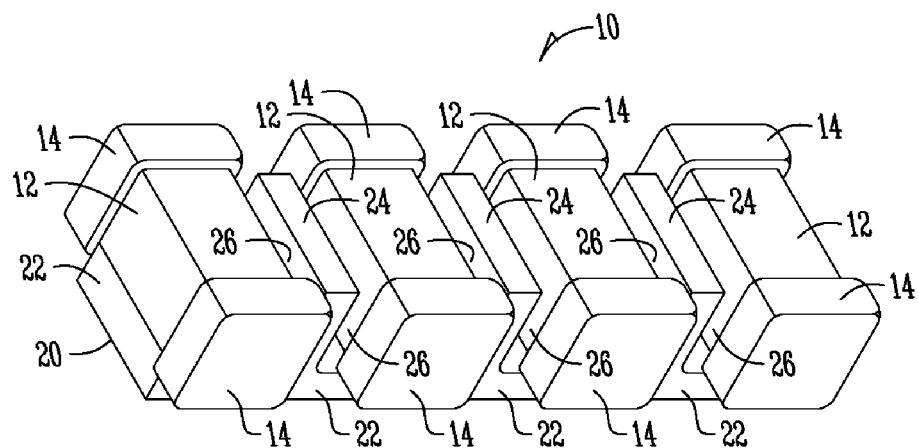

6 Claims, 3 Drawing Sheets

METHOD OF MAKING A FRAME PACKAGE ARRAY DEVICE

CROSS-REFERENCE TO RELATED APPLICATIONS

This application is a divisional of U.S. Ser. No. 11/296,141 filed Dec. 7, 2005, which is a non-provisional application of provisional application U.S. Ser. No. 60/733,275 filed Nov. 3, 2005, which applications are hereby incorporated by reference in their entirety.

BACKGROUND OF THE INVENTION

The present invention relates to component array packaging. Specifically, the present invention relates to a frame packaged array electronic or optical component and method of making.

The present invention will be shown and described for use with electronics, however, it can also be used with optic devices.

As electronic devices, such as cardiac care devices, continue to increase in functionality while the device sizes are reduced, reductions in circuit board real estate is desired. Low voltage multi-layer ceramic capacitors are currently used extensively in medical and other electronic equipment for filtering applications. Miniaturization of the components for some filter designs require two or more capacitors with very closely matched capacitance. For this reason, arrays containing two or more matched capacitors that can be placed on a printed circuit or PC board in a single operation have been used.

Capacitor arrays having two or more capacitors within a single monolithic multilayer ceramic component are available. The capacitors within such components have terminations that connect to separate sets of interleaved inner electrodes within the device. When these components are placed in a circuit board, the single array behaves like two or more individual multi-layer ceramic capacitors placed side by side. Other electronic devices have similar types of arrays.

Arrays have the advantages of replacing two or more standard multilayer capacitors with one component that can be placed on a PC board in a single operation, rather than one operation for each part. In addition, the area required on a PC board for an array is less than that for individual multilayer ceramic capacitors. This is an advantage for applications where space is at a premium.

As technology advances and there is a requirement to reduce the size of the array, there is a serious disadvantage to this approach. As the proximity of the electrodes of two or more capacitors within an array get closer together as the part size is reduced, the electric fields in the two separate capacitors can interact through the mutual ceramic interface resulting in crosstalk detrimental to the performance of the circuit. Additionally, it is not easy to test the individual capacitors within the array without developing special test equipment. Another problem with this type of array is that since this is a single monolith, the array is restricted to one ceramic dielectric type. Furthermore, if one capacitor in the array is defective, the entire array is defective.

U.S. Pat. No. 6,058,004 discloses a method of epoxy bonding two or more multilayer ceramic capacitors together with a resistor or inductor into a single component. In this way there is no single material forming a direct link between the electrodes of the capacitors or other components so crosstalk is minimized. This method has the advantage that the individual standard type components can be tested prior to assembly of the array and unlike the monolithic approach, the arrays can be formed with components of widely different materials and sizes. Arrays of multi-layer ceramic capacitors small as 0603 case size (length=0.063+/−0.005"; width=0.031+/−0.005") have been used to form Epoxy Bonded Arrays in this way. However, there are also significant limitations to this approach with respect to further size reductions to realize further area reductions in circuit designs, specifically it is difficult to maintain the spacing tolerances and alignment of the capacitors during the placement operation. Therefore, it is desirable to have an improved frame packaged array electronic component which can accommodate smaller electronic components.

In view of the foregoing, it is a primary feature or advantage of the present invention to provide an improved frame packaged array electronic component.

Another feature or advantage of the present invention is a reduced size electronic component array, in terms of smaller surface area, and/or lower head room.

Another feature or advantage of the present invention is an electronic component array system which can be tested using traditional testing methods for the electronic components.

Another feature or advantage of the present invention is an electronic array having multiple electronic components which can be placed on a circuit board in a single action.

Another feature or advantage of the present invention is an electronic component array device which can withstand the high temperatures of surface mounting electronic components to a circuit board.

Another feature or advantage of the present invention is an electronic frame packaged array device which can form an electronics array using different types of electronics components in the same array.

Another feature or advantage of the present invention is an electronics array device which allows for uniform or controlled spacing between electronics components in the array.

A further feature or advantage of the present invention is an electronics array device which gives rigidity to multiple electronics components contained within the array.

A further feature or advantage of the present invention is the provision of a frame packaged array electronic component which is economical to manufacture, durable in use, and efficient in operation.

A still further feature or advantage or advantage of the present invention is a frame packaged array electronic component method of manufacturing and assembling the electronic component array.

One or more of these and/or other objects, features or advantages of the invention will be apparent from the specification and claims that follow.

BRIEF SUMMARY OF THE INVENTION

One or more of the foregoing features or advantages may be achieved by an array frame for holding a plurality of electronic components as an array having a spine and one or more ribs extending axially from the spine allowing the plurality of components to locate on the spine adjacent the one or more ribs, wherein the components form a plane for attaching the components to a relatively planar circuit board.

Another aspect of the present invention is an array frame for holding a plurality of electronic components as an array which is constructed from plastic.

One or more of the foregoing features or advantages may also be achieved by an electronic device array having an array frame with a spine and one or more ribs protruding axially from the spine and a plurality of electronic components attached to the spine adjacent the one or more ribs, where the components form a plane for attaching the components to a relatively planar circuit board. The electronic components may be capacitors, resistors, conductors, or other electronic devices.

One or more of the foregoing features or advantages may also be achieved by an electronic circuit having a printed circuit board, an electronic device array with an array frame which has a spine and one or more ribs protruding axially from the spine, and a plurality of electronic components attached to the spine adjacent the one or more ribs where the components form a plane for attaching the components to a relatively planar circuit board and one or more of the electronic components are electrically connected to the circuit board. The components are preferably surface mounted devices.

One or more of the foregoing features or advantages may also be achieved by a method of making an electronic package array assembly device by selecting electronic components to include in the array assembly and attaching the electronic components to an array frame so that the electronic components can be electrically connected to a printed circuit board. Other aspects of the invention may include testing the electronic components, applying a bonding agent to hold the electronic components in place on the array frame, or arranging and packaging the array assembly for automated placement onto circuit boards.

The term array, as used in this application, refers to a plurality of electronic devices, such as two capacitors, being coupled together in a single device for placement on a circuit board. In this way, the operation of placing parts on the circuit board can put the multiple part array onto the circuit board in a single operation. This is desirable as a time saving element and also in situations where the electronic components are desired to be matched or specific in tolerances. In this case, the electronic components can be matched before assembled into the array. The array of the present invention can hold any number of electronic devices and the electronic devices can be any type and style of electronic devices, such as, but not limited to, surface mount or through hole mount, resistors, capacitors, inductors, or other electronic devices.

BRIEF DESCRIPTION OF THE FIGURES AND DRAWINGS

Figure 2:
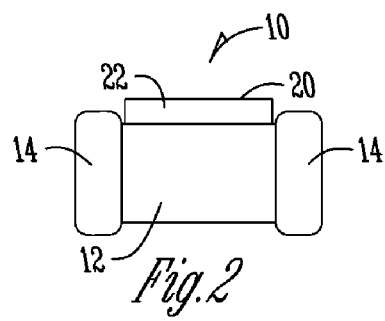
Figure 3:
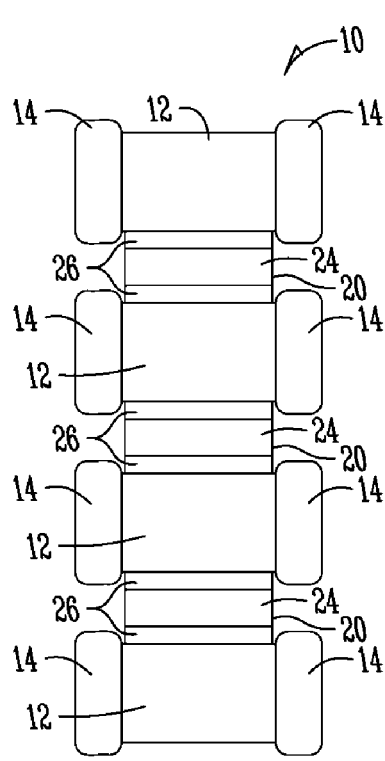
Figure 4:
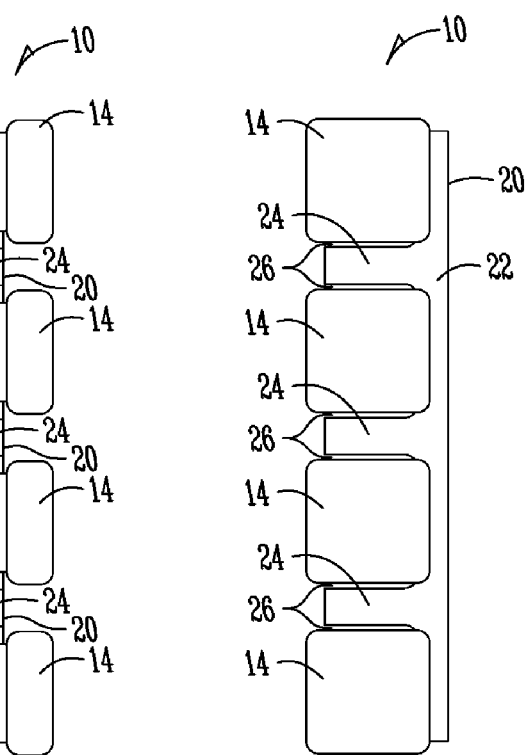
Figure 5:
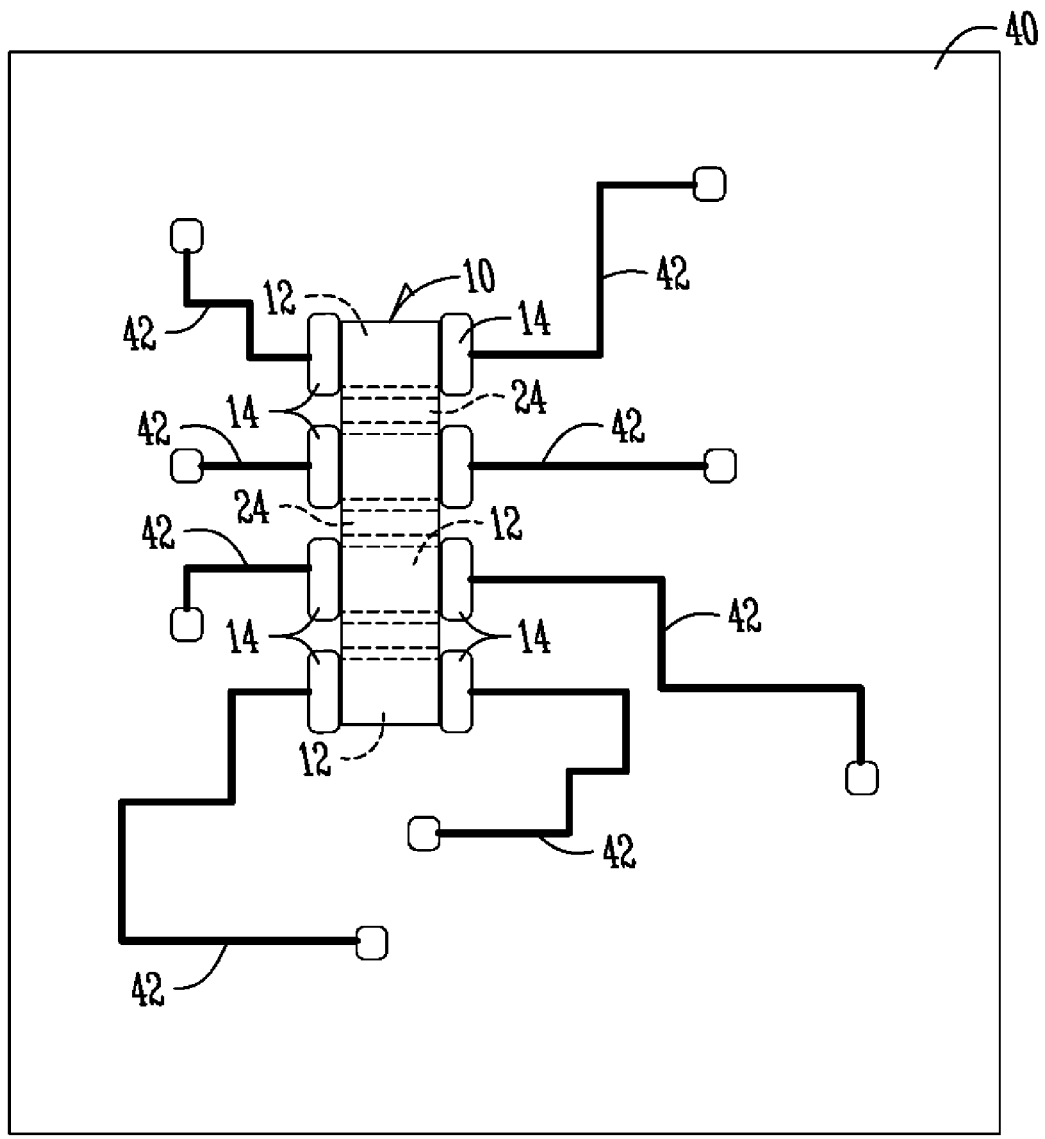
Figure 6:
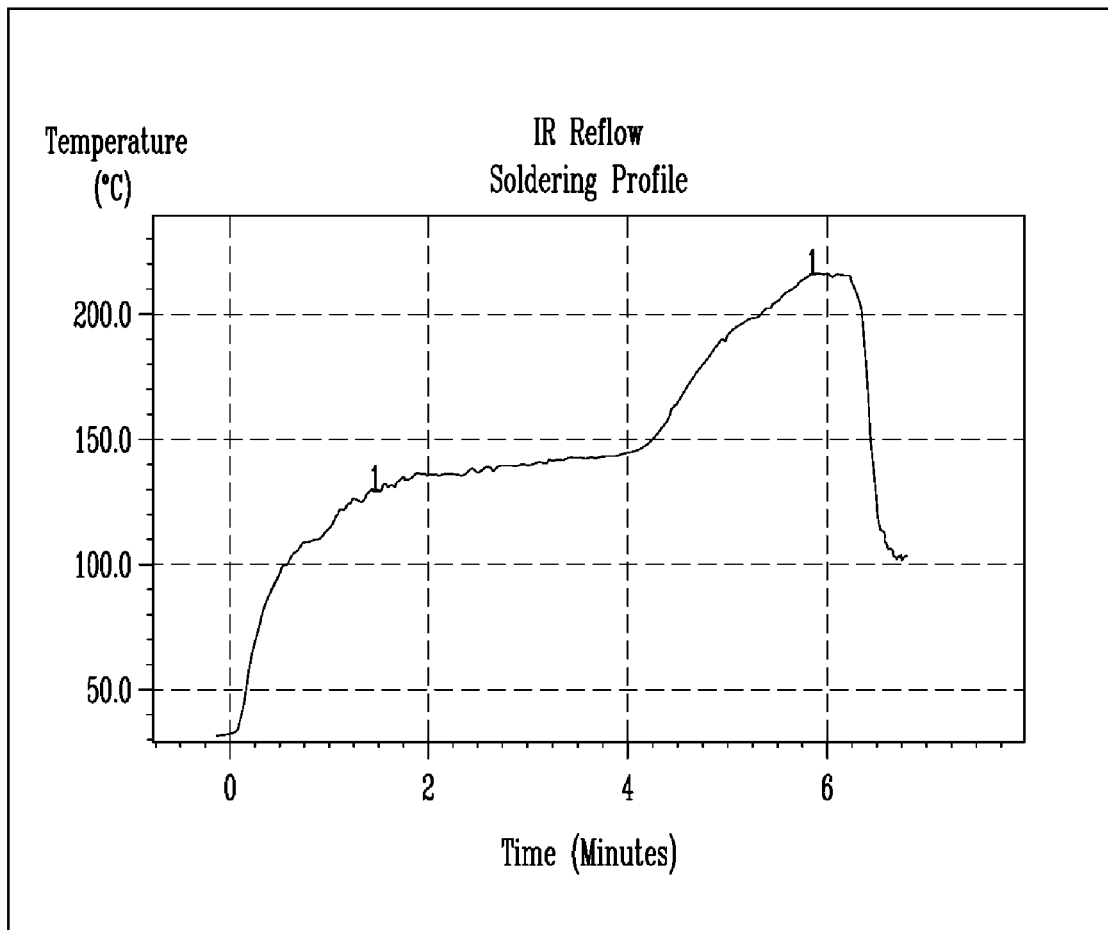

FIG. 1 is an isometric view of one embodiment of the frame packaged array electronic component.
FIG. 2 is an end view of FIG. 1.
FIG. 3 is a front view of FIG. 1.
FIG. 4 is a side view of FIG. 1.
FIG. 5 is one embodiment of an electronic circuit using the electronic component array system of the present invention.
FIG. 6 is an exemplary soldering profile for using an electronic component array system of the present invention for attaching the electronic components to a printed circuit board.

DETAILED DESCRIPTION OF THE PREFERRED EMBODIMENT

FIGS. 1-4 show one embodiment of a frame packaged array assembly 10. The frame packaged array assembly 10 can be constructed to hold any number of electronic components 12. The electronic components 12 are preferably surface mount resistors, inductors, or capacitors. However, any type of electronic component 12 can be used with the present invention.

The array frame 20 for holding the frame packaged array assembly 10 together as shown, has a spine 22 and ribs 24. The ribs 24 extend axially from the spine 22 and allow for spacing between electronic components 12, to keep the electronic components 12 separated from one another on the frame packaged array assembly 10. As the electronic components 12 are located on the array frame 20 there may or may not be a gap 26 between the ribs 24 and the electronic components 12. The electronic components 12 may be held to the array frame 20 as a friction fit, or may be held with a bonding agent. This allows the electronic components 12 to attach to the array frame 20 until the array assembly 10 is placed onto a printed circuit board 40 as shown in FIG. 5.

The frame packaged array assembly 10 is configured so that the terminals 14 on the electronic component 12 can be soldered to traces 42 on the printed circuit board 40. Preferably, the ribs 24 do not extend far enough out from the spine 22 to interfere with the terminals 14 of the electronic components 12 contacting the traces 42 on the printed circuit board 40 when the frame packaged array assembly 10 is located on the printed circuit board 40. In other words, the ribs 24 should be shorter than the width of the electronic component 12 plus any distance which the terminal 14 extends past the width of the electronic component 12.

It is noted that the frame packaged array assembly 10 can be used with any size, number, and type of electronic component 12. In addition, the frame packaged array assembly 10 can be used with any type of circuit on a printed circuit board 40 which requires multiple electronic components 12. The electronic components 12 can be tested before installation onto the array frame 20, which will allow for matched components on the array assembly 10.

A sample soldering process IR reflow profile is given in FIG. 6 which can be used for soldering the electronic components 12 to the traces 42 of the printed circuit board 40. Other IR reflow profiles can be used with the present invention.

The array frame 20 is preferably made of a plastic material which does not shrink or warp or otherwise become defective during the heating and soldering process. The preferred plastic material to make the array frame 20 is a liquid crystal polymer. However other types of materials can be used to make the array frame 20.

In summary, the present invention is essentially a molded plastic frame 20 into which two or more discrete two-terminal 14 electronic components 12, such as capacitors, resistors, or inductors, can be packaged. The function of the plastic frame 20 is to align and space the electronic components 12 in a single device or array 10 that allows the two-terminals 14 of each component to be separately contacted or soldered to the PC board during final assembly into a circuit. The frame 20 may be made to hold the components 12 in place by friction or a bonding agent may be used. Additionally, the spine 22 of the frame 20 forms a single surface for the pick and place equipment used in circuit board assembly.

The material used in the frame 20 must be capable of being molded to tight tolerances and be able to sustain high temperature soldering operations to form electrical contacts in the circuit assembly operation after placement. If a bonding agent is used to bond the components 12 within the frame 20, the bonding agent must also be capable of surviving the soldering operation.

An exemplary frame packaged array assembly 10 is described in the following example:

The frame packaged array assembly 10 is best shown in FIGS. 1-5. The array frame 20 was constructed using liquid crystal polymer plastic. The array frame 20 was developed to allow, in this example, four 0402 capacitors (length=0.04+/−0.004"; width'0.020+/−0.004"). In this example, a bonding agent epoxy mount compound was used to hold the capacitors to the frame 20 by applying the epoxy prior to placing the parts in the frame 20 and curing the epoxy at 125° C. for 15 minutes. This example was successfully soldered to a circuit board using the solder profile shown in FIG. 6 with no distortion or cracking of the frame 20 or damage to the capacitors.

In this example, the four capacitors are assembled onto a single component within a maximum area of 0.0052 square inches (0.118"×0.044"). This can be compared to a typical 0612 array made by bonding four 0603 capacitors or within a single component within an area of no less than 0.0072 square inches. The frame packaged array assembly 10 reduces the area required by over 25% while maintaining the advantages of no crosstalk from bonding individual multilayer ceramic capacitors together. In addition, the spine 22 of the frame 20 provides a single flat surface to pick and place the assembled part onto a printed circuit board. The array assembly 10 can then be soldered to the printed circuit board, such as 40 in FIG. 5 using a process profile as shown in FIG. 6.

The invention has been shown and described above with the preferred embodiments, and it is understood that many modifications, substitutions, and additions may be made which are within the intended spirit and scope of the invention. From the foregoing, it can be seen that the present invention accomplishes at least all of its stated objectives.

What is claimed is:

1. A method of making a frame packaged array device for holding a plurality of surface mount electronic components for attaching to a circuit board, each component having an electronic component body and first and second opposite terminations, the method comprising:

selecting electronic components to include in the array device; and attaching the electronic components to an array frame only via the electronic component body, the array frame having an elongated spine and a plurality of ribs protruding axially from one side of the spine, the plurality of electronic components being attached to the array frame and located adjacent to the spine and between respective ribs for attaching the electronic components to the circuit board.

2. The method of claim 1 further comprising testing the electronic components.

3. The method of claim 1 further comprising applying a bonding agent to hold the electronic components in place on the array frame.

4. The method of claim 1 further comprising arranging and packaging the array assembly for automated placement onto circuit boards.

5. The method of claim 1 further comprising electrically attaching the electronic components to the printed circuit board.

6. The method of claim 1 wherein each electronic component is held between the elongated spine and respective ribs via a friction fit.

* * * * *